United States Patent [19]
Paschke et al.

[11] Patent Number: 4,875,963

[45] Date of Patent: Oct. 24, 1989

[54] PROCESS FOR PREPARING A TRANSFER METALLIZATION FILM

[75] Inventors: Klaus Paschke, Homburg-Reiskirchen; Guenther Crass, Taunusstein-Wehen; Peter Dinter, Hallgarten, all of Fed. Rep. of Germany

[73] Assignee: Hoechst Aktiengesellschaft, Frankfurt am Main, Fed. Rep. of Germany

[21] Appl. No.: 220,931

[22] Filed: Jul. 18, 1988

Related U.S. Application Data

[63] Continuation of Ser. No. 910,614, Sep. 23, 1986, abandoned.

[30] Foreign Application Priority Data

Sep. 27, 1985 [DE] Fed. Rep. of Germany ....... 3534398

[51] Int. Cl.$^4$ .......................... B05D 3/06; B32B 31/00
[52] U.S. Cl. ...................................... 156/249; 427/39; 427/152; 427/171; 427/404
[58] Field of Search ................. 427/39, 152, 404, 322, 427/171; 156/249

[56] References Cited

U.S. PATENT DOCUMENTS

| | | | |
|---|---|---|---|
| 4,615,906 | 10/1986 | Kolbe et al. ........................ | 427/40 |
| 4,649,097 | 3/1987 | Tsukada et al. .................. | 427/40 X |

*Primary Examiner*—Bernard Pianalto
*Attorney, Agent, or Firm*—Foley & Lardner, Schwartz, Jeffery, Schwaab, Mack, Blumenthal & Evans

[57] ABSTRACT

To prepare a transfer metallization film which is metallized on one side, the first application of a metal layer to one side of the film web is preceded by a one-sided electric corona discharge applied to the other, not-to-be-metallized, side of the film web. The second and any further application of a metal layer on the same side of the film are not preceded by a corona discharge step.

16 Claims, No Drawings

PROCESS FOR PREPARING A TRANSFER METALLIZATION FILM

This application is a continuation of application Ser. No. 910,614, filed Sept. 23, 1986, abandoned.

BACKGROUND OF THE INVENTION

The invention relates to a process for preparing a transfer metallization film which is metallized on one side, and to a transfer metallization film based on a biaxial stretch-oriented multilayer film prepared by coextruding polypropylene.

For specific packaging purposes there exists a high demand for composite materials composed of paper and metal, in particular aluminum foil, which increases from year to year. Although extremely thin metal foils are already used, and are indeed adequate, for such composite materials, further savings of the scarce and costly metal by the use of metallized papers are desirable. The metallization of paper is carried out in the state of the art by two different processes. In the first process, paper is directly coated with metal vapor in a high vacuum, while in the second process an extraneous substrate is coated with a metal layer, and the latter is then transferred to paper. The second process is also referred to as transfer metallization.

The direct vapor deposition onto paper is crucially affected by the choice of a suitable grade of paper, and it further requires a costly pretreatment of the paper. This pretreatment comprises either sealing the paper with a coat of lacquer, or a drying step whereby the normal water content of the paper is reduced from 6-7% down to about 3%. After the deposition of metal vapor, the paper must then be brought back to the normal water content. These steps are costly and time consuming.

In the process of transfer metallization, a plastic film, usually based on polyolefin or polyester, is subjected to vapor deposition in a high vacuum. The metallized film is coated with a contact adhesive on the metallized side and is brought into contact with the paper to be metallized, which can in this case be chosen as desired, according to the requirements of the end use. After the full curing of the contact adhesive, the plastic film is peeled off the composite, leaving the metal layer behind on the paper. The process of transfer metallization can be carried out economically only if the plastic film can be used repeatedly. Conventional films can normally be reused up to six times.

German Patent Application P 34 34 298.2 describes a film made of thermoplastic polymer, which, in the transfer metallization from the film onto paper, is economically reusable up to 20 times. However, even the first metallization step gives rise to a serious disadvantage which considerably impairs product quality and hence the utility of the film and of the process. This disadvantage takes the form of flash discharges which, for example, during the vapor deposition of the metal layer onto the film, lead to so-called "Lichtenberg figures". These figures impair the uniform appearance of the metal layer and, after the transfer of the metal layer to the paper or plastic film base material, cause the appearance of the base material to become unsightly and thus unusable for predominantly decorative purposes.

Various attempts have been made to overcome this problem. Such attempts include metallizing the second side of the film for the purpose of conducting away the charge, intensive discharging of the film before metallization by means of electric discharging means, antistatic finishing of the film's raw material or of the film surface, and flame treatment of the nonmetallized side of the film. However, not only have all of these techniques failed to produce the desired success, but they make the manufacturing process for the transfer metallization film more complicated and hence, in the final analysis, more expensive.

SUMMARY OF THE INVENTION

It is an object of the present invention to provide a process which makes it possible to eliminate the electric discharge phenomena during the one-sided vapor deposition of a metal layer onto a film in a simple manner.

It is still another object of the present invention to provide a process for making a transfer metallization film which can be used repeatedly after a single electric corona discharge treatment on the side which is not to be metallized, without further electric corona discharge treatments. It is still another object of the present invention to provide a transfer metallization film which resists blocking in final roll form.

It is still another object of the present invention to provide a transfer metallization film which will not build up static electric charge It is still another object of the present invention to provide a process for making a transfer metallization film which can be used repeatedly without losing its effectiveness as a material for applying metallized coatings for transfer purposes It is still another object of the present invention to provide a transfer metallization film, having a first and a second side, which is comprised of predominantly propylene homopolymer and which is subjected to electric corona discharge treatment on the first side and is subsequently metallized on the second side.

It is still another object of the present invention to provide a transfer metallization film comprising a biaxially stretch-oriented multilayer composite comprising a middle layer of predominantly propylene homopolymer and top and bottom layers comprising predominantly propylene homopolymer with viscosities lower than the propylene homopolymer of said middle layer.

DETAILED DESCRIPTION OF THE PREFERRED EMBODIMENTS

The invention comprises a process for subjecting a film web of polypropylene film, before the first application of a metal layer onto one side of the film web, to a one-sided electric corona discharge on the other side of the film web, i.e., on the side which is not to be metallized.

In the development of the process according to the invention, the air is evacuated from the interior of a hollow drum electrode which is equipped with openings in the drum shell and over which the film web is guided, to establish contact which is free from air inclusions between the film web side to be metallized and the drum shell, and at the same time the one-sided electric corona discharge takes place between a number of counter-electrodes and that side of the film web guided over the drum electrode which faces away from the drum shell.

In the process, a single application of an electric corona discharge is sufficient for applying a metal layer, so that no corona discharge step is needed before the second and any further application of a metal layer to the same side of the polypropylene film.

The film which, before the first metallizing, is subjected to the one-sided electric corona discharge in accordance with the process steps described above can be, for example, a transfer metallization film based on a biaxially stretch-oriented multilayer film prepared by coextruding polypropylene and comprising a base layer of propylene homopolymer and, applied thereto on both sides, top layers, the base layer containing an additive depot of migrating monomers in an amount of 0.01 to 2.0% by weight, based on the weight of the polymers forming the base layer, and the top layers comprising polypropylene which has a lower viscosity that the polypropylene of the base layer.

An additive depot of migrating monomers is to be understood as meaning an addition to the base layer of compounds which, owing to forces of diffusion, are capable of gradually transferring from the base layer into the top layers and of developing their actions there. The additives present in the base layer are in particular a combination of stearamide and of a hydroxyethylalkylamine having alkyl chains in the range from 14 to 20 carbon atoms.

The top layers can preferably additionally contain inert additives which improve the lubricity of the film and/or the antiblocking properties of the film. These are, for example, inorganic additives such as calcium carbonate, barium sulfate, silicon dioxide, aluminum silicate and the like.

Further details of such transfer metallization film are described in German Patent Application P 34 34 298.2 (corresponding to U.S. Ser. No. 775,529).

An essential feature with the metallizing of the film according to the invention is that the electric corona discharge is applied to that side of the film web which is not metallized. The metallization as such in general takes place by vapor deposition of metal onto the film in a high vacuum.

With this process it is absolutely vital to prevent the corona discharge from affecting that side of the film which is metallized. This is because the consequence would be that the excellent metal adhesion, resulting from the corona discharge, to the film side could prevent the subsequent transfer of the metal layer to the paper or plastic film substrate to be metal-coated. In this context, it is self-evident that the electric corona discharge can only be used when it is certain that the damaging secondary effect associated with the corona discharge, namely, the reverse side effect, is ruled out. The reverse effect in the electric corona pretreatment of material webs, in particular of plastic films, is the unwanted and undesirable exposure of the film web reverse side to the corona discharge, which gives rise to unfavorable adhesion and sliding properties of the film web on winding up and off and on stacking. The cause of the reverse effect is the incomplete emplacement of the film web on the drum which forms one of the electrodes for the corona discharge. In addition to surface defects on the drum, such as, for example, holes, pores, impressions, scratches, it is in particular the ingress of air between the drum surface and the film web which gives rise to the reverse side effect, since then the film web does not rest smoothly on the drum surface. This phenomenon is particularly noticeable in very wide high-speed film processes where the enclosed air between the film web and the drum surface can no longer flow off toward the edges of the web. Even an only partially arising reverse effect causes problems in the transfer of the metal layer to the paper or plastic film substrate and impairs the reusability of the film for further metallization steps.

Since the appearance of reverse side effects is exclusively a question of a contact between film web and drum electrode which is free of air inclusions, it is necessary to employ for the corona discharge a corresponding apparatus for the surface treatment of film webs by means of electric corona discharge. Suitable for this purpose is essentially the apparatus described in German Offenlegungsschrift 3,203,806, which comprises a drum electrode, at least one grounded counter-electrode coordinated therewith, and, connected to the drum electrode via a lead, a generator for producing a high-frequency alternating voltage. The grounded counter-electrodes can be tip electrodes in the form of combs, knives, teeth or thin wires. The drum electrode has a central hollow axle which has openings in its surface and the inner hollow space of which is connected to a vacuum pump for evacuating the air. An outer and an inner tube of the drum electrode likewise have a plurality of perforations arranged between individual electrodes, so that a connection exists from the surface of the drum electrode to the interior of the hollow axle of the drum electrode. With an apparatus constructed in that way, the troublesome air film inevitably introduced by the film web is removed by applying a vacuum to the drum electrode, and as a result it is achieved that the film web rests close-up, without air inclusions, against the surface of the drum electrode. As a result it is ensured that the film web can be subjected to a correspondingly intensive corona discharge without danger that the corona discharge can also spread over to the reverse side, in this case to the film web side flat against the drum surface.

The process of exposing the transfer metallization film before its first metallization to an electric corona discharge does away with the phenomenon of flash discharges in the course of the metallization in a simple and effective manner, so that the film is available for its intended use, namely, the multiple reusability as a base material for metal layers to be transferred.

What is claimed is:

1. A process for preparing a transfer metallization film which is subsequently, metallized on one side, comprising the steps of: subjecting a film web having a first and second side and being comprised of predominantly propylene homopolymer to an electric corona discharge treatment on a first side of said only of said film web by guiding said film web over an electrode and subjecting said film web to electric corona discharge treatment by means of at least one counterelectrode on said first side of said film web facing said counterelectrodes; and subsequently metallizing the second side of the film web.

2. A process as claimed in claim 1, wherein said electrode comprises a hollow drum electrode having openings in the drum shell by which air is evacuated from the interior of said drum in order to establish contact between said film web and said drum electrode, which contact is free from air conclusion.

3. A process as claimed in claim 1, wherein said film web is subjected to said electric corona discharge treatment at the same time said film web is guided over said hollow drum electrode and between said counterelectrode.

4. A process as claimed in claim 1, in which subsequent applications of a metal layer to the film web may be performed without repeating said electric corona discharge treatment of the side of the film web not to be metallized.

5. A process as claimed in claim 1, wherein said film web comprises a biaxially stretch-oriented multilayer composite comprised of more than one layer of predominantly propylene homopolymer.

6. A process as claimed in claim 1, wherein said film web comprises a biaxially stretch-oriented multilayer composite comprising a middle layer of predominantly propylene homopolymer and top and bottom layers comprising predominantly propylene homopolymer with viscosities lower than the propylene homopolymer of said middle layer.

7. A process as claimed in claim 6, wherein said middle layer of said multilayer composite comprises predominantly propylene homopolymer with an additive depot comprising migrating monomers in an amount from about 0.01 to 2.0% by weight based on the weight of said propylene homopolymer forming said middle layer.

8. A process as claimed in claim 7, wherein said additive depot of migrating monomers comprises a combination of stearamide and a hydroxyethylalkylamine having alkyl chains in the range from about 14 to 20 carbon atoms.

9. A process as claimed in claim 6, wherein said top and bottom layers of said multilayer composite comprise predominantly propylene homopolymers with the addition of inert additives to improve the lubricity and antiblocking properties of said multilayer composite.

10. A process as claimed in claim 9, wherein said inert additives comprise calcium carbonate, barium sulfate, silicon dioxide, or aluminum silicate.

11. A method for producing a metallized paper web, comprising the steps of:
   a) preparing a transfer metallization film by the process claimed in claim 1;
   b) coating the metal surface of the transfer metallization film with an adhesive;
   c) laminating the adhesive-coated metallized film with a paper web, with the adhesive contacting the paper web; and
   d) subsequently removing the film web to leave the metal layer bonded to the paper substrate.

12. A method as defined by claim 11, further comprising the steps of
   e) remetallizing the second side of said film web and repeating steps b) through d).

13. A method as defined by claim 12, further comprising the steps of again repeating step e).

14. A method as defined by claim 13, wherein step e) is again repeated up to about 20 times.

15. A process for preparing a transfer metallization film which is subsequently metallized on one side, comprising the steps of:
   providing a film web comprised of predominantly propylene homopolymer and having a first side and a second side which is subsequently metallized;
   guiding the film web over an electrode;
   subjecting the film web to an electric corona discharge treatment by means of at least one counter electrode on the first side of the film web facing the counter electrodes;
   preventing the corona discharge from affecting the second side of the film; and
   subsequently metallizing the second side of the film web.

16. A process according to claim 15, wherein the contact between the film web and the electrode is free of air inclusions.

* * * * *